United States Patent
Murabayashi et al.

(10) Patent No.: US 12,237,638 B2
(45) Date of Patent: Feb. 25, 2025

(54) CONNECTOR

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Yorikazu Murabayashi, Yokkaichi (JP); Suguru Yamagishi, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 332 days.

(21) Appl. No.: 17/783,306

(22) PCT Filed: Nov. 19, 2020

(86) PCT No.: PCT/JP2020/043114
§ 371 (c)(1),
(2) Date: Jun. 8, 2022

(87) PCT Pub. No.: WO2021/117451
PCT Pub. Date: Jun. 17, 2021

(65) Prior Publication Data
US 2023/0015822 A1     Jan. 19, 2023

(30) Foreign Application Priority Data
Dec. 10, 2019  (JP) .................................. 2019-222649

(51) Int. Cl.
*H01R 9/05*   (2006.01)
*H01R 12/53*  (2011.01)
*H01R 12/58*  (2011.01)

(52) U.S. Cl.
CPC ............ *H01R 9/0515* (2013.01); *H01R 12/53* (2013.01); *H01R 12/58* (2013.01)

(58) Field of Classification Search
CPC ...... H01R 9/0515; H01R 12/53; H01R 12/58; H01R 13/6589; H01R 13/6595;
(Continued)

(56) References Cited

U.S. PATENT DOCUMENTS

| | | |
|---|---|---|
| 6,575,761 B1 | 6/2003 | Regnier |
| 7,384,306 B2 | 6/2008 | Malstrom et al. |

(Continued)

FOREIGN PATENT DOCUMENTS

| | | |
|---|---|---|
| CN | 1349288 A | 5/2002 |
| CN | 101009415 A | 8/2007 |

(Continued)

OTHER PUBLICATIONS

Dec. 28, 2020 International Search Report issued in International Patent Application No. PCT/JP2020/043114.

(Continued)

*Primary Examiner* — Briggitte R. Hammond
(74) *Attorney, Agent, or Firm* — Oliff PLC

(57) ABSTRACT

Resonance between outer conductors is prevented. A connector includes: a plurality of shield terminals each having an inner conductor surrounded by an outer conductor; and a resonance restriction member that restricts resonance between the shield terminals by connecting the outer conductors to each other and holding the outer conductors at the same potential. Resonance between the shield terminals can (Continued)

be prevented by preventing a potential difference from being generated between the outer conductors.

9 Claims, 6 Drawing Sheets

(58) Field of Classification Search
CPC .... H01R 24/50; H05K 3/3447; H05K 3/3426; H05K 2201/10189
See application file for complete search history.

(56) References Cited

U.S. PATENT DOCUMENTS

| | | |
|---|---|---|
| 7,789,678 B2 | 9/2010 | Nagata et al. |
| 9,595,795 B2 | 3/2017 | Lane et al. |
| 9,608,388 B2 | 3/2017 | Kondo et al. |
| 9,692,168 B1 | 6/2017 | Schroll et al. |
| 10,411,374 B2 | 9/2019 | Tanaka et al. |
| 10,483,662 B2 | 11/2019 | Yamaguchi |
| 2007/0173116 A1 | 7/2007 | Nagata et al. |
| 2008/0026612 A1 | 1/2008 | Malstrom et al. |
| 2014/0248803 A1 | 9/2014 | Scherer et al. |
| 2016/0164232 A1 | 6/2016 | Ane et al. |
| 2016/0261080 A1 | 9/2016 | Kondo et al. |
| 2018/0097300 A1 | 4/2018 | Tanaka et al. |
| 2019/0305445 A1 | 10/2019 | Yamaguchi |

FOREIGN PATENT DOCUMENTS

| | | |
|---|---|---|
| CN | 101162823 A | 4/2008 |
| CN | 107887714 A | 4/2018 |
| CN | 110247202 A | 9/2019 |
| CN | 110350367 A | 10/2019 |
| JP | H10-241791 A | 9/1998 |
| JP | 2002-216908 A | 8/2002 |
| JP | 2012-248390 A | 12/2012 |
| JP | 2014-241251 A | 12/2014 |
| JP | 2016-162642 A | 9/2016 |
| WO | 2013/062823 A1 | 5/2013 |

OTHER PUBLICATIONS

Jul. 6, 2021 International Preliminary Report on Patentability issued in International Patent Application No. PCT/JP2020/043114.

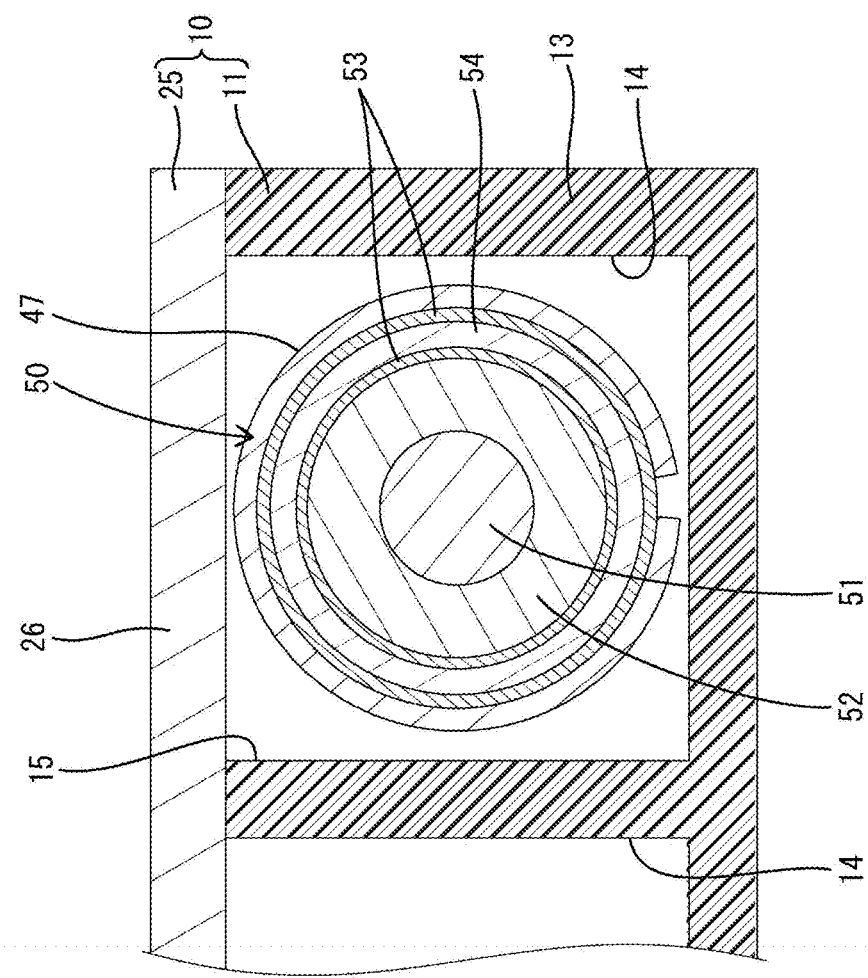

CONNECTOR

TECHNICAL FIELD

The present disclosure relates to a connector.

BACKGROUND ART

Patent Literature 1 discloses, as a connector used in a vehicle-mounted communication circuit, a connector in which multiple split connectors each having a shield terminal are combined so as to be adjacent to each other. The shield terminal has a central conductor surrounded by an insulator, the insulator being surrounded by an outer conductor. The shield terminals are accommodated in a housing and disposed adjacent to each other.

CITATIONS LIST

Patent Literature

Patent Literature 1: JP 2014-241251 A

SUMMARY OF INVENTION

Technical Problems

In order to reduce the size of this type of connector, the shield terminals may be disposed close to each other. However, in a case where the shield terminals are disposed close to each other, resonance occurs between the shield terminals when a potential difference is generated between adjacent outer conductors. If resonance occurs between the shield terminals, isolation deteriorates at a specific frequency, with the result that communication performance may deteriorate.

A connector of the present disclosure has been completed based on the above circumstances, and an object thereof is to prevent resonance between outer conductors.

Solutions to Problems

A connector of the present disclosure includes:
a plurality of shield terminals each having an inner conductor surrounded by an outer conductor; and
a resonance restriction member that restricts resonance between the shield terminals by connecting the outer conductors to each other and holding the outer conductors at the same potential.

Advantageous Effects of Invention

According to the present disclosure, resonance between outer conductors can be prevented.

BRIEF DESCRIPTION OF DRAWINGS

FIG. 6 is a partially enlarged cross-sectional view illustrating a connection structure between the shield terminal and a coaxial cable.

DESCRIPTION OF EMBODIMENTS

Hereinafter, embodiments of the present disclosure will be described in detail.

(1) A connector of the present disclosure includes:
a plurality of shield terminals each having an inner conductor surrounded by an outer conductor; and
a resonance restriction member that restricts resonance between the shield terminals by connecting the outer conductors to each other and holding the outer conductors at the same potential. According to this configuration, resonance between the shield terminals can be prevented by preventing a potential difference from being generated between the outer conductors.

(2) Preferably, the plurality of shield terminals is accommodated in a housing, and the resonance restriction member forms a part of the housing. According to this configuration, the resonance restriction member forms a part of the housing, and thus a number of components can be reduced, as compared with a case where a dedicated component separate from the housing is used as the resonance restriction member.

(3) In (2), preferably the housing includes a terminal holding member that holds the plurality of shield terminals, and the resonance restriction member includes an assembly portion that holds the resonance restriction member and the terminal holding member in an assembled state. According to this configuration, the resonance restriction member has the assembly portion, and thus the resonance restriction member can be assembled to the terminal holding member without using other members.

(4) In (3), preferably, the resonance restriction member includes a board attachment portion to be attached to a circuit board, and in a state where the resonance restriction member is attached to the terminal holding member and the circuit board, the terminal holding member is sandwiched between the resonance restriction member and the circuit board. According to this configuration, in a state where the resonance restriction member is attached to the circuit board, there is no possibility that the terminal holding member may come off the circuit board.

(5) The resonance restriction member preferably has a protruding contact point that comes into contact with the outer conductor. According to this configuration, the resonance restriction member and the outer conductor can be reliably brought into contact with each other by the protruding contact point.

(6) The resonance restriction member preferably includes a board connection portion to be connected to a ground circuit of a circuit board. According to this configuration, the resonance restriction member is directly connected to the ground circuit at the board connection portion, and thus the resonance restriction member can be connected to the ground circuit without using other members.

DETAILED DESCRIPTION OF EMBODIMENTS

Example 1

Figure 1:
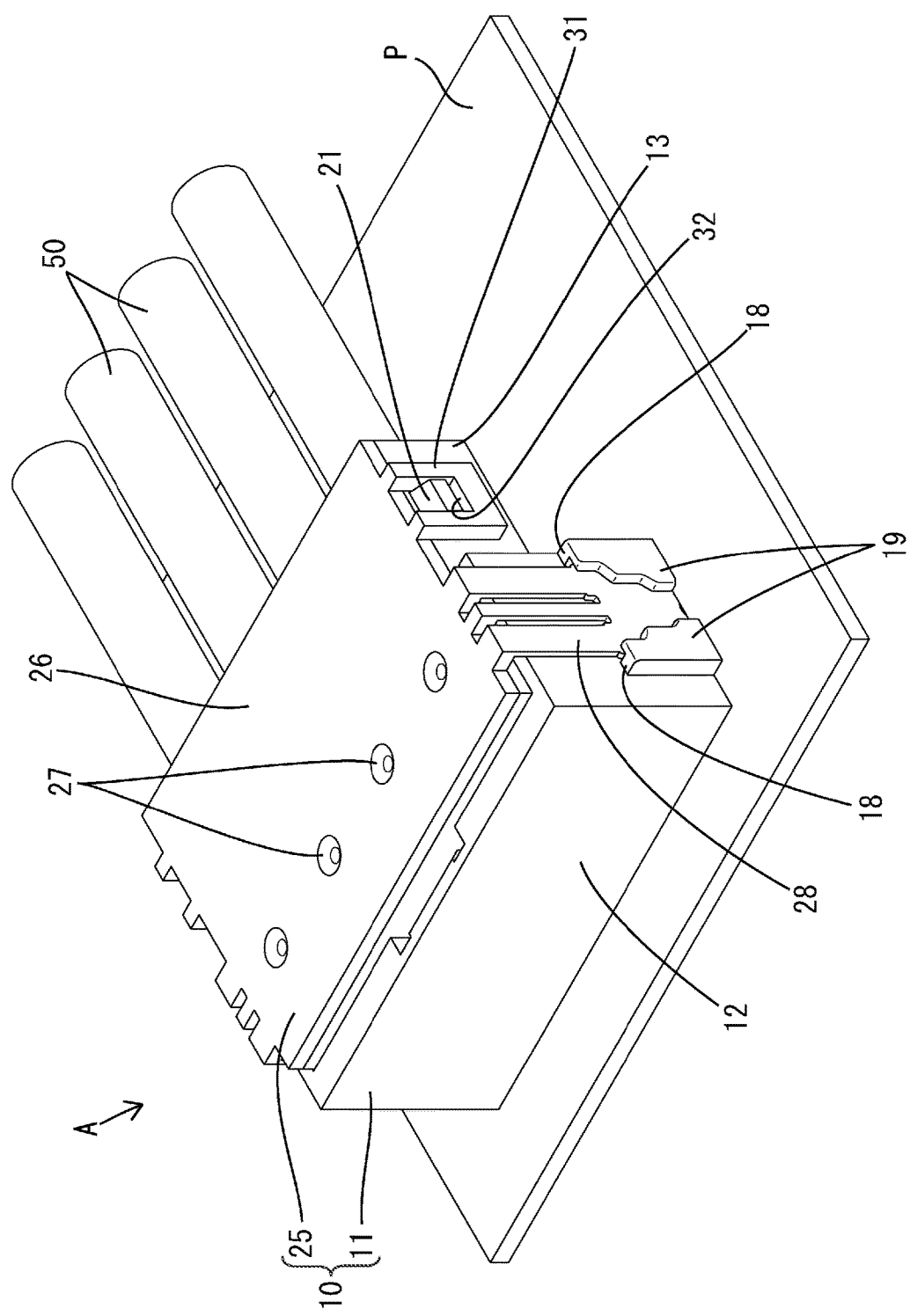
FIG. 1 is a perspective view illustrating a state in which a connector of Example 1 is attached to a circuit board.
Figure 2:
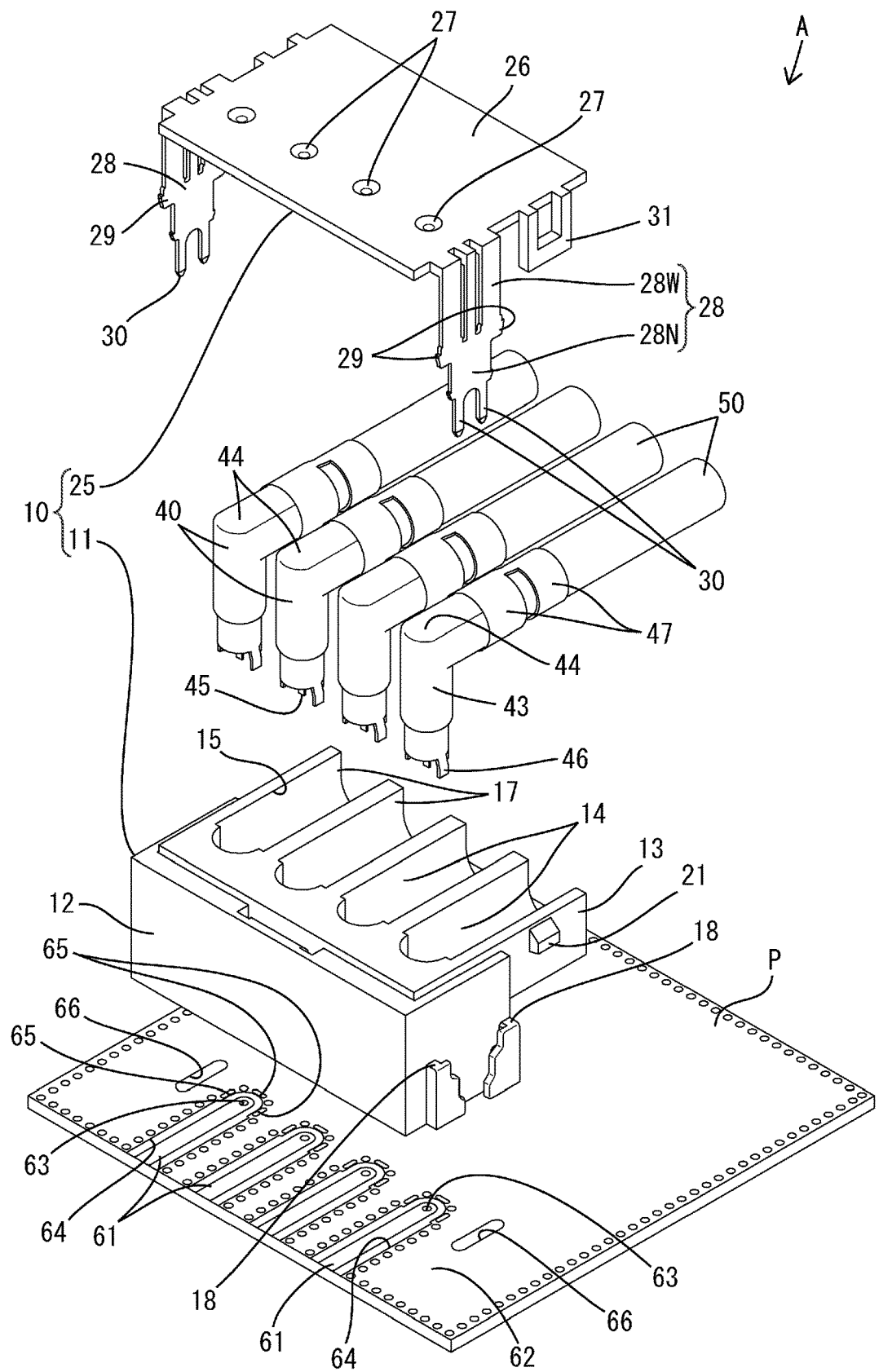
FIG. 2 is a perspective view illustrating a state where the connector is disassembled.
Figure 3:
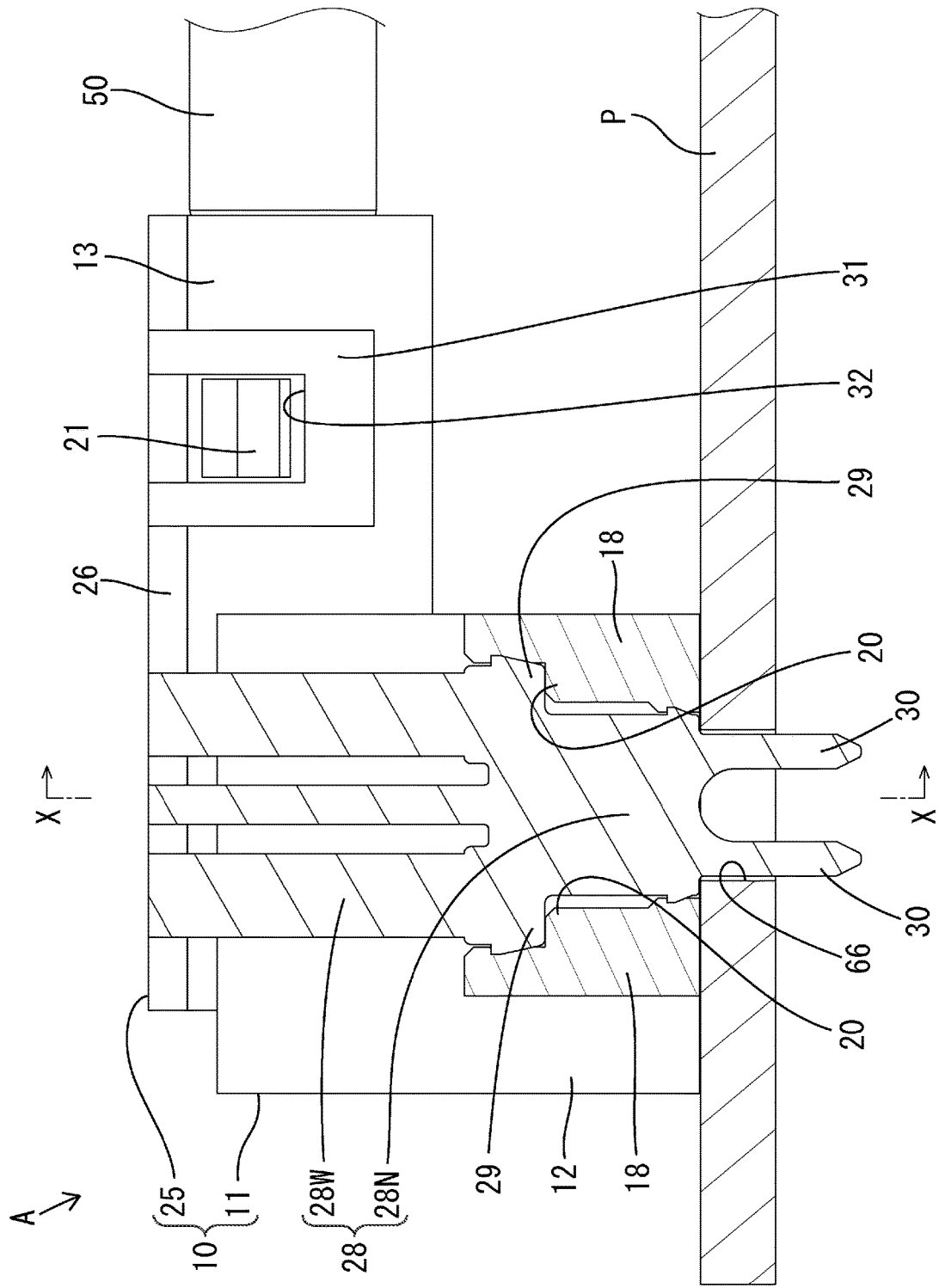
FIG. 3 is a cross-sectional view illustrating an assembly structure of a terminal holding member and a resonance restriction member.
Figure 4:
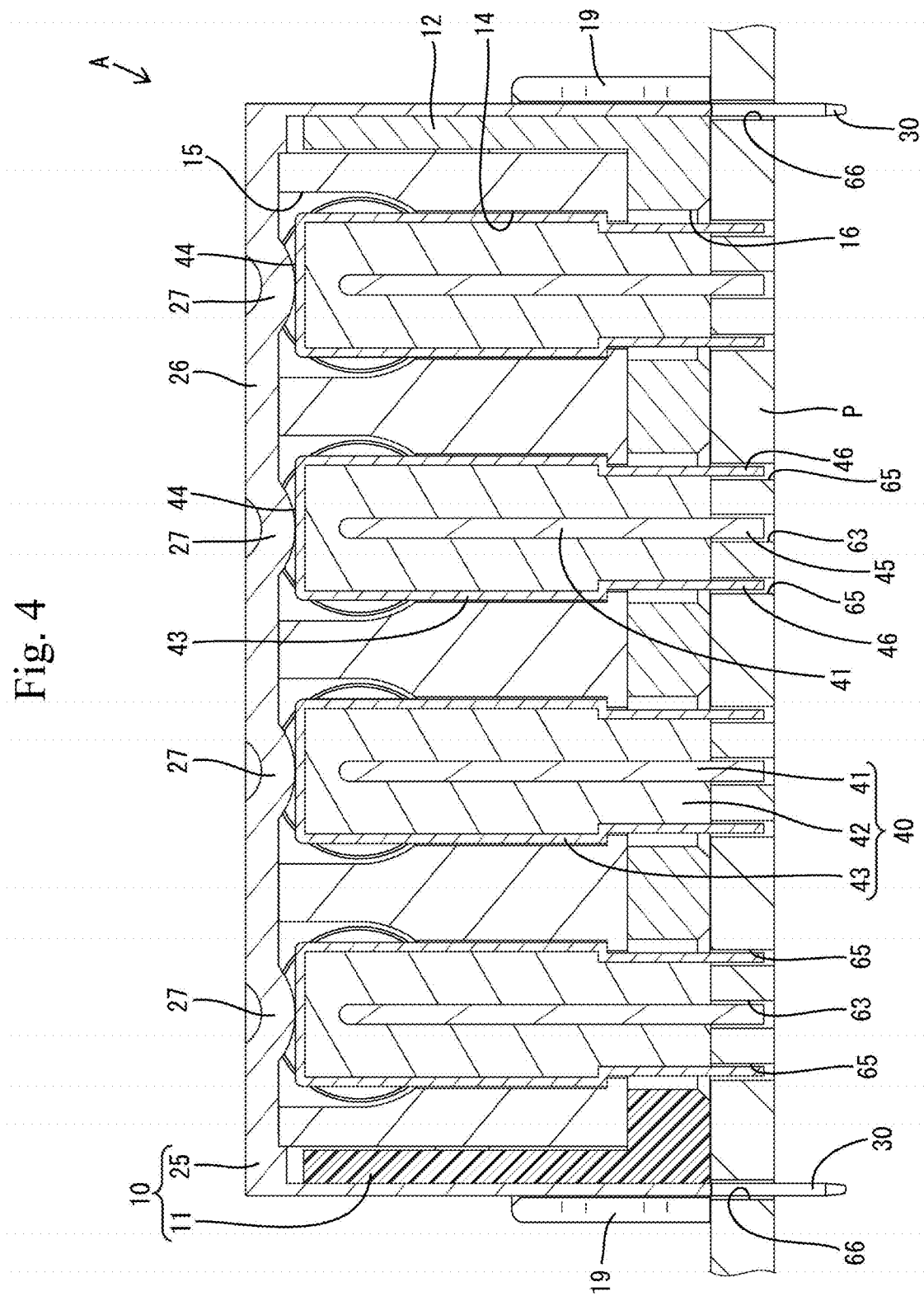
FIG. 4 is a cross-sectional view taken along a line X-X of FIG. 3.

Hereinafter, Example 1 that embodies a connector A of the present disclosure will be described with reference to FIGS. 1 to 6. Note that the present invention is not limited to the described examples, but is presented in the claims, and is intended to encompass all modifications within the meaning and scope equivalent to the claims. In Example 1, with regard to the longitudinal direction, the diagonally lower left side in FIGS. 1, 2, and 5 and the left side in FIG. 3 are defined as the front side. With respect to the vertical direction, the orientations appearing in FIGS. 1 to 6 are defined as the upper and lower sides as they are. With respect to the lateral direction, the orientations appearing in FIG. 4 are defined as the left and right sides as they are.

The connector A of the present embodiment includes a housing 10 and a plurality of (four in this Example) shield terminals 40, and is attached to a circuit board P. The housing 10 is formed by assembling a laterally symmetrical terminal holding member 11 made of a synthetic resin and a laterally symmetrical resonance restriction member 25 made of a conductive material such as a metal. The terminal holding member 11 includes a board fixing portion 12 and an electric wire lead-out portion 13 protruding rearward from an upper end side region of a rear surface of the board fixing portion 12. In a side view of the terminal holding member 11 viewed from the side, the terminal holding member 11 has a shape bent in an L shape by the board fixing portion 12 and the electric wire lead-out portion 13.

In the terminal holding member 11, four terminal accommodation chambers 14 are formed at intervals in the lateral direction. Each of the terminal accommodation chambers 14 is a space having a shape bent in an L shape, similarly to the shape in the side view of the terminal holding member 11. The terminal accommodation chamber 14 is opened to a rear end surface, an upper surface, and a lower surface of the terminal holding member 11. As shown in FIGS. 2 and 4, an upper surface opening 15 is formed on the upper surface of the terminal holding member 11 over the board fixing portion 12 and the electric wire lead-out portion 13. The upper surface opening 15 opens the upper ends of the plurality of terminal accommodation chambers 14 to the outside of the terminal holding member 11.

As illustrated in FIG. 4, a lower surface opening 16 is formed in a lower surface of the board fixing portion 12, which opens a lower end portion of a front end portion of each terminal accommodation chamber 14 toward the outside of the terminal holding member 11, that is, toward the circuit board P side. As illustrated in FIG. 2, a rear surface opening 17 which opens a rear end portion of the terminal accommodation chamber 14 to the outside of the terminal holding member 11 is formed in a rear surface of the electric wire lead-out portion 13. The rear surface opening 17 communicates with the upper surface opening 15.

On both left and right outer surfaces of the board fixing portion 12 of the terminal holding member 11, a pair of front and rear symmetrical guide portions 18 are formed in a protruding manner. The pair of guide portions 18 are each formed with a side wall portion 19 projecting from an outer side surface of each of the guide portions 18 toward the counterpart guide portion 18. As illustrated in FIG. 3, the pair of guide portions 18 are each formed with a receiving portion 20 in a form in which an opposing surface facing the counterpart guide portion 18 is notched in a stepped shape. The side wall portion 19 is disposed so as to cover the receiving portion 20 from the outside. A pair of lock protrusions 21 are formed on both left and right outer surfaces of the electric wire lead-out portion 13 of the terminal holding member 11.

The resonance restriction member 25 is a single component including a cover portion 26 having a flat plate shape, a pair of left and right plate-shaped leg portions 28, and a pair of left and right elastic lock pieces 31. In a plan view of the resonance restriction member 25 viewed from above, the cover portion 26 has a rectangular shape and covers the upper surface opening 15 of the terminal holding member 11. The same number of contact points 27 as the terminal accommodation chambers 14 are formed in a region in front of a center of the cover portion 26 in the longitudinal direction. The contact points 27 are formed by beating out a part of the cover portion 26, and protrude downward from a lower surface of the cover portion 26.

The leg portions 28 each have a function as a board attachment portion for attaching the housing 10 to the circuit board P and a function as a board connection portion for connecting the resonance restriction member 25 to the circuit board P. The leg portion 28 extends downward at a right angle and in a cantilever manner from a front end portion of left and right side edge portions of the cover portion 26. The leg portion 28 includes a wide portion 28W and a narrow portion 28N having a smaller width dimension in the longitudinal direction than the wide portion 28W. Upper ends of the wide portions 28W are continuous with left and right outer edge portions of the cover portion 26. The narrow portion 28N is continuous with a lower end portion of the wide portion 28W in a flush manner.

The narrow portion 28N extends downward in a cantilever manner from the lower end of the wide portion 28W. A pair of pressing portions 29 are formed at both front and rear end portions of the lower end portion of the wide portion 28W by a dimensional difference in the longitudinal direction between the wide portion 28W and the narrow portion 28N. A pair of front and rear insertion portions 30 are formed at a lower end portion of the narrow portion 28N. The elastic lock pieces 31 each extend downward at a right angle and in a cantilever manner from a rear end portion of left and right side edge portions of the cover portion 26. The elastic lock piece 31 has a lock hole 32.

As illustrated in FIG. 4, the shield terminals 40 each include an inner conductor 41, a dielectric 42 accommodating the inner conductor 41, and an outer conductor 43 surrounding the dielectric 42. Similarly to the terminal holding member 11 and the terminal accommodation chamber 14, the shield terminal 40 has a shape bent in an L shape in a side view. Each of the inner conductor 41, the dielectric 42, and the outer conductor 43 has a shape bent in an L shape. The inner conductor 41 is made of a conductive rod material bent in an L shape. A communicating connection portion 45 for connection to a communication circuit 61 of the circuit board P is formed at a lower end portion of the inner conductor 41.

The outer conductor 43 has a tubular shape bent in an L shape. A front end portion of an upper surface of the outer conductor 43 serves as a contact surface 44 with which the contact point 27 of the cover portion 26 is brought into contact. A plurality of (three in Example 1) grounding connection portions 46 for connection to a ground circuit 62 of the circuit board P is formed at a lower end portion of the outer conductor 43. The grounding connection portions 46 are disposed at intervals in the circumferential direction and each have a protruding shape. An open barrel-shaped crimping portion 47 is formed at a rear end portion of the outer conductor 43.

A front end portion of the coaxial cable 50 is connected to a rear end portion of the shield terminal 40. As illustrated in FIG. 6, the coaxial cable 50 has a known form in which an internal conductor 51 is surrounded by an insulator 52, the insulator 52 is surrounded by a shield layer 53 made of a braided wire or the like, and an outer periphery of the shield layer 53 is covered with a sheath 54. The internal conductor 51 is connected to a rear end portion of the inner conductor 41. The crimping portion 47 of the outer conductor 43 is fixed and adhered to an outer periphery of a portion, which is folded back to an outer periphery of the sheath 54, of a front end portion of the shield layer 53 by crimping.

The shield terminal 40 is accommodated so as to fall into the terminal accommodation chamber 14 from above the terminal holding member 11. In a state where the shield terminal 40 is accommodated in the terminal accommodation chamber 14, the contact surface 44 of the outer conductor 43 is exposed to an upper outside of the terminal holding member 11 at a front end portion of the upper surface opening 15. The coaxial cable 50 is led out rearward from the rear surface opening 17 of the electric wire lead-out portion 13. The four shield terminals 40 attached to the housing 10 as described above are disposed in a line in the lateral direction (horizontal direction) parallel to the circuit board P at the same height.

After the shield terminals 40 are attached to the terminal holding member 11, the resonance restriction member 25 is assembled to the terminal holding member 11. At the time of assembly, the cover portion 26 is superposed on the upper surface of the terminal holding member 11. In the process of assembling the resonance restriction member 25, the leg portion 28 is inserted between the pair of guide portions 18 to position the resonance restriction member 25 in the longitudinal direction with respect to the terminal holding member 11. In the assembly process, a lower end portion of the elastic lock piece 31 interferes with the lock protrusion 21 and is thus elastically deformed.

When the resonance restriction member 25 is correctly assembled to the terminal holding member 11, the lower end portion of the elastic lock piece 31 passes over the lock protrusion 21, and the lock hole 32 of the elastic lock piece 31 elastically restored is fitted to the lock protrusion 21. By this fitting, the terminal holding member 11 and the resonance restriction member 25 are locked in the assembled state. The insertion portions 30 of the narrow portion 28N protrude downward to be lower than the lower ends of the guide portions 18, and the pair of front and rear pressing portions 29 abut on the receiving portions 20 of the guide portions 18 from above. Since side edge portions of the pressing portions 29 bite into the guide portions 18, the leg portions 28 are press-fitted between the guide portions 18. Both front and rear side edge portions of the narrow portion 28N are also press-fitted between the guide portions 18. Thus, the assembly of the housing 10 and the attachment of the shield terminals 40 to the housing 10 are completed.

The resonance restriction member 25 closes the upper surface opening 15 of the terminal holding member 11 and covers the upper surfaces of the shield terminals 40. The resonance restriction member 25 is assembled to the terminal holding member 11, thereby forming the housing 10. The shield terminals 40 are accommodated in the housing 10. Each of the contact points 27 of the resonance restriction member 25 is in contact with the contact surface 44 on the upper surface of the front end portion of the shield terminal 40. Since the contact points 27 individually come into contact with the outer conductors 43 of the shield terminals 40, the outer conductors 43 adjacent in the housing 10 are short-circuited, so that no potential difference is generated between the adjacent outer conductors 43.

Figure 5:
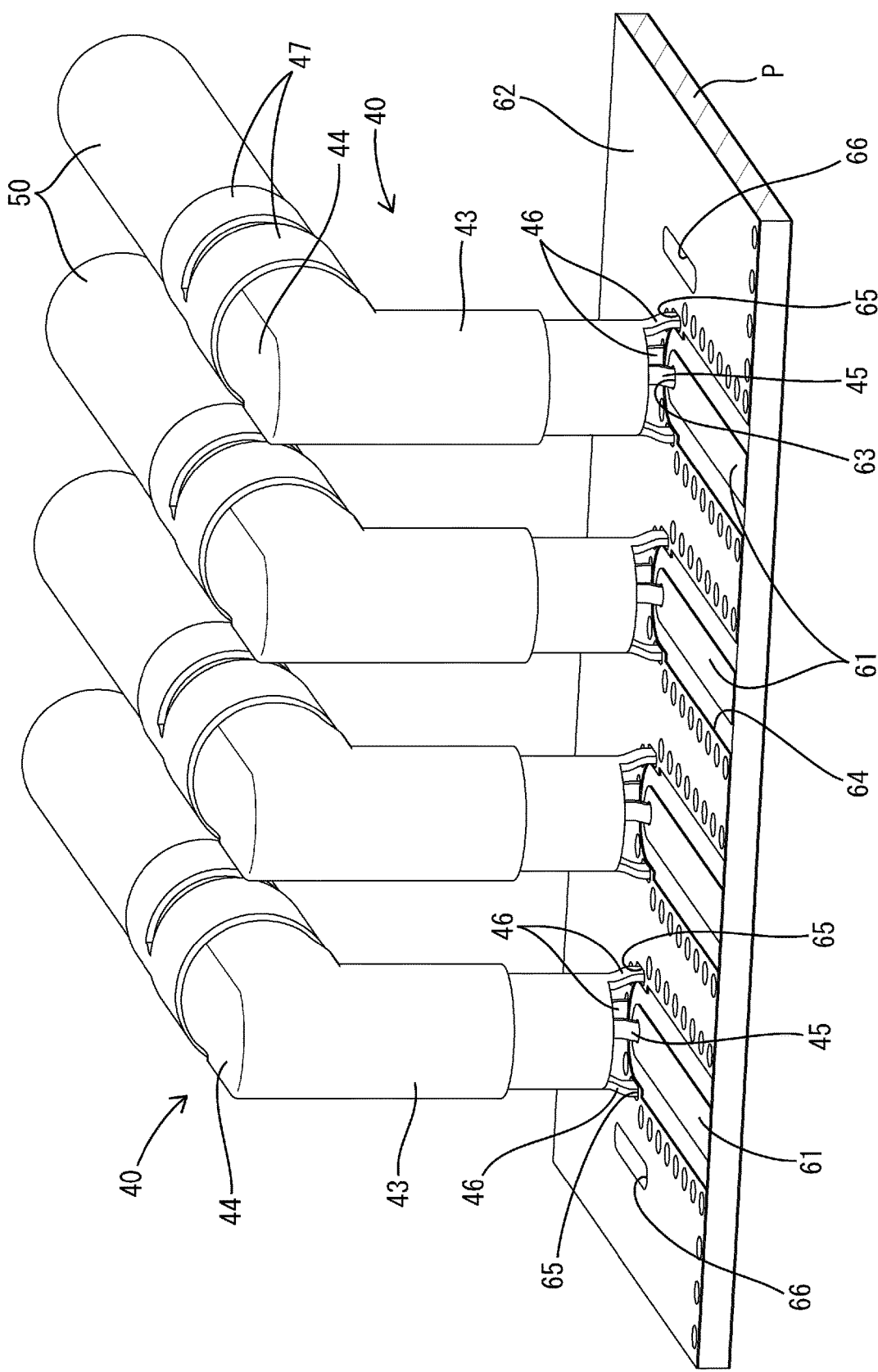
FIG. 5 is a perspective view illustrating a connection structure between a shield terminal and the circuit board.

The connector A assembled in the above manner is mounted on an upper surface of the circuit board P disposed horizontally. As illustrated in FIGS. 2 and 5, a plurality of communication circuits 61 and one ground circuit 62 are printed on the upper surface (front surface) of the circuit board P. The ground circuit 62 is also printed on a lower surface (back surface) of the circuit board P. In the plurality of communication circuits 61, regions on a rear end portion side on which the connector A is mounted are disposed at intervals in the lateral direction. A communicating through-hole 63 in a penetrating form is formed at the rear end portion of each communication circuit 61.

The ground circuit 62 is formed over a wide range including a region of the circuit board P where the connector A is mounted. A plurality of cutouts 64 for individually disposing the communication circuits 61 is formed in the ground circuit 62 on the upper surface side of the circuit board P. The rear end region of the communication circuit 61 is disposed in each of the cutouts 64. In the ground circuit 62, a plurality of grounding first through-holes 65 in a penetrating form and a pair of grounding second through-holes 66 in a penetrating form are formed.

In a state where the connector A is attached to the circuit board P, the communicating connection portions 45 of the inner conductors 41 are inserted into the communicating through-holes 63 and attached to the circuit board P by soldering in a state of being electrically conducted to the communication circuits 61. The grounding connection portions 46 of the outer conductors 43 are inserted into the grounding first through-holes 65 and attached to the circuit board P by soldering in a state of being electrically conducted to the ground circuit 62. The insertion portions 30 of the pair of leg portions 28 are inserted into the grounding second through-holes 66 and attached to the circuit board P by soldering in a state of being electrically conducted to the ground circuits 62 on both the front and back surfaces of the circuit board P. The outer conductors 43 of the shield terminals 40 are connected to the ground circuit 62 via the resonance restriction member 25. By soldering the insertion portions 30 to the circuit board P, the housing 10 is fixed to the circuit board P.

The leg portions 28 in which the insertion portions 30 are formed each have the pressing portions 29. Since the pressing portions 29 press the receiving portions 20 of the terminal holding member 11 from above, the terminal holding member 11 is pressed against the upper surface of the circuit board P. Since the leg portion 28 is press-fitted between the guide portions 18 of the terminal holding member 11, the terminal holding member 11 and the resonance restriction member 25 are held in an assembled state.

The connector A of Example 1 includes a plurality of shield terminals 40 each having the inner conductor 41 surrounded by the outer conductor 43, and the resonance restriction member 25 which restricts resonance between the shield terminals 40. The resonance restriction member 25 electrically conducts the outer conductors 43 to each other and thereby holds the outer conductors 43 at the same potential. The resonance restriction member 25 has the protruding contact point 27 which comes into contact with the contact surface 44 of the front end portion of the upper surface of each of the outer conductors 43. By the protruding contact point 27, the resonance restriction member 25 and the outer conductor 43 can be reliably brought into contact with each other. According to this configuration, resonance between the shield terminals 40 can be prevented by preventing a potential difference from being generated between the outer conductors 43.

The plurality of shield terminals 40 is accommodated in a housing 10. Since the resonance restriction member 25 forms a part of the housing 10, the number of components can be reduced as compared with a case where a dedicated part separate from the housing 10 is used as the resonance restriction member 25. The housing 10 includes the terminal holding member 11 which holds the plurality of shield terminals 40. The resonance restriction member 25 includes the elastic lock pieces 31 as a lock portion that holds the resonance restriction member 25 and the terminal holding member 11 in an assembled state. Since the resonance restriction member 25 has the elastic lock pieces 31, the resonance restriction member 25 can be assembled to the terminal holding member 11 without using other members.

The resonance restriction member 25 has the leg portions 28 as a board attachment portion to be attached to the circuit board P. The leg portions 28 are fixed to both the terminal holding member 11 and the circuit board P. In a state where the resonance restriction member 25 is attached to the terminal holding member 11 and the circuit board P, the guide portions 18 of the terminal holding member 11 are sandwiched between the pressing portions 29 formed in the leg portions 28 of the resonance restriction member 25 and the upper surface of the circuit board P. According to this configuration, in a state where the resonance restriction member 25 is attached to the circuit board P, there is no possibility that the terminal holding member 11 may come off the circuit board P.

The resonance restriction member 25 has the leg portions 28 as a board connection portion to be connected to the ground circuit 62 of the circuit board P. The resonance restriction member 25 is directly connected to the ground circuit 62 at insertion portions 30 of the leg portions 28. Therefore, the resonance restriction member 25 can be directly connected to the ground circuit 62 without using other members. Since the resonance restriction member 25 is directly connected to the ground circuit 62 of the circuit board P, all of the outer conductors 43 of the shield terminals 40, the resonance restriction member 25, and the ground circuit 62 of the circuit board P become at the same potential, which enhances the effect of preventing resonance between the adjacent outer conductors 43. Note that, by connecting the resonance restriction member 25 to the ground circuit 62, the resonance restriction member 25 and the ground circuit 62 (GND) of the circuit board P become at the same potential. However, even if there is a potential difference between the resonance restriction member 25 and the ground circuit 62, resonance between the shield terminals 40 can be prevented as long as there is no potential difference between all of the outer conductors 43.

OTHER EXAMPLES

The present invention is not limited to the example described by the above description and drawings, but is presented in the claims. The present invention is intended to encompass all modifications within the meaning and scope equivalent to the claim, and also to encompass the following embodiments.

In the above example, the resonance restriction member forms a part of the housing, but may not form the housing.

In the above example, the resonance restriction member and the terminal holding member are directly assembled, but may be assembled via another member.

In the above example, in a state where the resonance restriction member is attached to the terminal holding member and the circuit board, the resonance restriction member sandwiches the terminal holding member between itself and the circuit board. However, the resonance restriction member may not sandwich the terminal holding member between itself and the circuit board.

In the above example, the resonance restriction member is directly connected to the ground circuit, but may be connected to the ground circuit via another member.

In the above example, the contact point is formed by beating out the cover portion toward the lower surface side. However, the contact point may be an elastically deformable spring provided on the lower surface of the cover portion.

In the above example, the housing is formed by assembling the terminal holding member made of a synthetic resin and the resonance prevention member made of a metal. However, the housing may be entirely composed of a member made of a metal only. In this case, a contact point with the outer conductor may be provided in the terminal accommodation chamber.

In the above example, the resonance restriction member has the cover portion that covers the upper surface opening of the terminal holding member, and the contact point formed in the cover portion is brought into contact with the outer conductor. However, the resonance restriction member may have a form without a cover portion. For example, a metal wire material or a metal plate material may be fixed to the outer conductor by welding or the like.

In the above example, the four shield terminals attached to the housing are disposed in a line in the lateral direction (horizontal direction) in parallel with the circuit board. However, the four shield terminals attached to the housing may be disposed in the vertical and lateral directions at the same pitch so as to be aligned when viewed from the front, or may be disposed in a line in the vertical direction at a right angle with respect to the circuit board.

In the above example, the four shield terminals are attached to the housing, but the number of shield terminals attached to the housing may be three or less, or five or more. In a case where the number of shield terminals is three or five or more, the shield terminals may be disposed in a pyramid shape (trefoil formation).

In the above example, the resonance restriction member is in contact with all of the shield terminals attached to the housing, but may be in contact with only some of the shield terminals attached to the housing.

REFERENCE SIGNS LIST

A Connector
P Circuit board
10 Housing
11 Terminal holding member
12 Board fixing portion
13 Electric wire lead-out portion
14 Terminal accommodation chamber
15 Upper surface opening
16 Lower surface opening
17 Rear surface opening
18 Guide portion
19 Side wall portion
20 Receiving portion
21 Lock protrusion
25 Resonance restriction member
26 Cover portion
27 Contact point
28 Leg portion
28N Narrow portion
28W Wide portion
29 Pressing portion
30 Insertion portion
31 Elastic lock piece
32 Lock hole 40 Shield terminal
41 Inner conductor
42 Dielectric
43 Outer conductor
44 Contact surface
45 Communicating connection portion
46 Grounding connection portion
47 Crimping portion
50 Coaxial cable
51 Internal conductor
52 Insulator
53 Shield layer
54 Sheath
61 Communication circuit
62 Ground circuit
63 Communicating through-hole
64 Cutout
65 Grounding first through-hole
66 Grounding second through-hole

The invention claimed is:

1. A connector that is mounted on a circuit board, the connector comprising:
   a plurality of shield terminals each having an inner conductor surrounded by an outer conductor;
   a resonance restriction member that restricts resonance between the shield terminals by connecting the outer conductors to each other and holding the outer conductors at the same potential; and
   a housing that accommodates the plurality of shield terminals,
   wherein
   the housing includes a terminal accommodation chamber and an opening that opens the terminal accommodation chamber,
   the shield terminals are accommodated in the terminal accommodation chamber from the opening, and
   the resonance restriction member forms a part of the housing by being assembled so as to close the opening.

2. A connector that is mounted on a circuit board, the connector comprising:
   a plurality of shield terminals each having an inner conductor surrounded by an outer conductor;
   a resonance restriction member that restricts resonance between the shield terminals by connecting the outer conductors to each other and holding the outer conductors at the same potential; and
   a housing that accommodates the plurality of shield terminals,
   wherein
   the housing includes a terminal holding member that holds the plurality of shield terminals, and
   the resonance restriction member includes an assembly portion that holds the resonance restriction member and the terminal holding member in an assembled state.

3. A connector comprising:
   a plurality of shield terminals each having an inner conductor surrounded by an outer conductor; and
   a resonance restriction member that restricts resonance between the shield terminals by connecting the outer conductors to each other and holding the outer conductors at the same potential,
   wherein
   the plurality of shield terminals is accommodated in a housing,
   the housing includes a terminal holding member that holds the plurality of shield terminals,
   the resonance restriction member includes a board attachment portion to be attached to a circuit board, and
   in a state where the resonance restriction member is attached to the terminal holding member and the circuit board, the terminal holding member is sandwiched between the resonance restriction member and the circuit board.

4. A connector that is mounted on a circuit board, the connector comprising:
   a plurality of shield terminals each having an inner conductor surrounded by an outer conductor; and
   a resonance restriction member that restricts resonance between the shield terminals by connecting the outer conductors to each other and holding the outer conductors at the same potential, wherein the resonance restriction member has a protruding contact point that comes into contact with the outer conductor.

5. The connector according to claim 1,
   wherein
   the housing includes a terminal holding member that holds the plurality of shield terminals, and
   the resonance restriction member includes an assembly portion that holds the resonance restriction member and the terminal holding member in an assembled state.

6. The connector according to claim 1, wherein the resonance restriction member has a protruding contact point that comes into contact with the outer conductor.

7. The connector according to claim 2, wherein the resonance restriction member has a protruding contact point that comes into contact with the outer conductor.

8. The connector according to claim 3, wherein the resonance restriction member has a protruding contact point that comes into contact with the outer conductor.

9. The connector according to claim 5, wherein the resonance restriction member has a protruding contact point that comes into contact with the outer conductor.

* * * * *